United States Patent
Kanaoka et al.

(10) Patent No.: US 8,465,828 B2
(45) Date of Patent: Jun. 18, 2013

(54) SURFACE-COATED CUTTING TOOL

(75) Inventors: Hideaki Kanaoka, Itami (JP); Minoru Itoh, Itami (JP); Yoshio Okada, Itami (JP); Chie Suzuki, Itami (JP); Anongsack Paseuth, Itami (JP)

(73) Assignee: Sumitomo Electric Hardmetal Corp., Itami-Shi, Hyogo (JP)

( * ) Notice: Subject to any disclaimer, the term of this patent is extended or adjusted under 35 U.S.C. 154(b) by 0 days.

(21) Appl. No.: 13/510,188

(22) PCT Filed: Apr. 4, 2011

(86) PCT No.: PCT/JP2011/058522
§ 371 (c)(1),
(2), (4) Date: May 16, 2012

(87) PCT Pub. No.: WO2012/008185
PCT Pub. Date: Jan. 19, 2012

(65) Prior Publication Data
US 2012/0231227 A1    Sep. 13, 2012

(30) Foreign Application Priority Data

Jul. 16, 2010 (JP) ................................. 2010-161905

(51) Int. Cl.
*B32B 3/00* (2006.01)
(52) U.S. Cl.
USPC ............................ 428/172; 428/156; 428/192
(58) Field of Classification Search
USPC ................... 428/156, 157, 192, 172
See application file for complete search history.

(56) References Cited

U.S. PATENT DOCUMENTS

2009/0211414 A1 * 8/2009 Fukano ............................. 83/13

FOREIGN PATENT DOCUMENTS

| JP | 05-057507 A | 3/1993 |
| JP | 07-216549 A | 8/1995 |
| JP | 10-310878 A | 11/1998 |
| JP | 2004-223711 A | 8/2004 |
| JP | 2005-279821 A | 10/2005 |
| WO | WO 02/04156 A1 | 1/2002 |
| WO | WO 2006011472 A1 * | 2/2006 |

OTHER PUBLICATIONS

International Search Report for PCT Application No. PCT/JP2011/058522 dated Jun. 14, 2011, pp. 1-2.

* cited by examiner

*Primary Examiner* — Catherine A Simone
(74) *Attorney, Agent, or Firm* — Ditthavong Mori & Steiner, P.C.

(57) ABSTRACT

A surface-coated cutting tool having excellent abrasion resistance and defect resistance is provided. The surface-coated cutting tool includes a substrate and a covering layer, wherein the covering layer includes one or two or more sublayers, a thickness $T_1$ of a portion of the covering layer having the smallest thickness in a cutting edge line portion and a thickness $T_2$ of the covering layer at a point 1 mm away from a cutting edge line in a rake face direction in a cross section cut by a particular plane satisfy $T_1 < T_2$, and a point a on the surface of the covering layer a distance $D_a$ away from the cutting edge line in the rake face direction and a point b on the surface of the covering layer a distance $D_b$ away from the cutting edge line in a flank face direction satisfy particularly numerical ranges of $D_a$ and $D_b$, and in 10% or more of a region E of the covering layer having a thickness in the range of $0.1\,T_1$ to $0.9\,T_1$ from the surface and extending from the point a to the point b, the deviation in the crystal orientation of crystal grains constituting the covering layer is 5 degrees or more and less than 10 degrees.

20 Claims, 1 Drawing Sheet

SURFACE-COATED CUTTING TOOL

TECHNICAL FIELD

The present invention relates to a surface-coated cutting tool that includes a substrate and a covering layer formed on the substrate.

BACKGROUND ART

Hitherto, cemented carbide cutting tools made of a WC-Co alloy or a WC-Co alloy to which a carbonitride of Ti and/or Ta, Nb, or the like has been added have been used for cutting of general steel or castings. During cutting, the cutting edges of the cutting tools are heated to high temperatures of 800° C. or more. The cemented carbide cutting tools therefore tend to cause plastic deformation because of heat generated by cutting. Thus, the flank wear tends to increase.

Thus, surface-coated cutting tools that include a base material (substrate) made of cemented carbide covered with a monolayer of carbide, nitride, or carbonitride of a group IVa metal (such as TiC, TiN, or TiCN) or a hard ceramic, such as $Al_2O_3$, or with a composite layer of the hard ceramics have been used so as to improve the cutting characteristics of the cutting tools at high temperatures. The covering layer is formed by a chemical vapor deposition method or a physical vapor deposition method, such as an ion plating method or an ion sputtering method.

Among the covering layers formed by these methods, a covering layer formed by a chemical vapor deposition method particularly has excellent adhesion to the cemented carbide base material and very high abrasion resistance. In response to the recent demand for high speed and high efficiency cutting, the thickness of the covering layer is increasing. Thus, the adhesion between the cemented carbide base material and the covering layer is important.

In the formation of the covering layer by a chemical vapor deposition method, the temperature of the covering layer is as high as approximately 1000° C. When cooled to room temperature after the formation of the covering layer, therefore, the covering layer has tensile stress caused by a difference in thermal expansion coefficient between the cemented carbide base material and the covering layer. The tensile stress propagates a crack occurring on the surface of the covering layer during cutting and causes falling off or chipping of the covering layer. More specifically, the cemented carbide base material has a thermal expansion coefficient of approximately $5.1 \times 10^{-6}$ $K^{-1}$, whereas the covering layer has a thermal expansion coefficient of approximately $9.2 \times 10^{-6}$ $K^{-1}$ for TiN, approximately $7.6 \times 10^{-6}$ $K^{-1}$ for TiC, or approximately $8.5 \times 10^{-6}$ $K^{-1}$ for $Al_2O_3$.

The thicknesses of the covering layers of commonly used surface-coated cutting tools are in the range of several micrometers to around ten micrometers. This is because although the abrasion resistance of the covering layer increases with the thickness, an increase in the thickness of the covering layer results in a higher possibility of damaging the tool and lower defect resistance of the surface-coated cutting tool.

Thus, various techniques have been proposed to improve the characteristics of the covering layer. For example, Japanese Unexamined Patent Application Publication No. 07-216549 (PTL 1) describes a technique for increasing the cutting life of a cutting tool by eliminating cracks in cooling after the formation of an alumina layer.

In accordance with Japanese Unexamined Patent Application Publication No. 05-057507 (PTL 2), the outermost layer made of TiN or TiCN is formed on the surface of a tool base material composed of a hard material by a chemical vapor deposition method, an $Al_2O_3$ film is formed as an inner layer adjacent to the outermost layer, and only a cutting edge portion of the tool is polished. In accordance with this technique for extending the life of the tool, the $Al_2O_3$ film thus exposed to the atmosphere can improve the welding resistance of chips and impact resistance during cutting.

CITATION LIST

Patent Literature

PTL 1: Japanese Unexamined Patent Application Publication No. 07-216549

PTL 2: Japanese Unexamined Patent Application Publication No. 05-057507

SUMMARY OF INVENTION

Technical Problem

However, even in the tool disclosed in PTL 1, tensile stress still remains in the covering layer. Thus, there is a problem that intermittent cutting at high speed and high efficiency still results in low defect resistance of the cutting tool. Furthermore, the thickness of the covering layer in the cutting edge line portion of the cutting tool is not reduced, or a stress is not applied to the covering layer in the cutting edge line portion of the cutting tool. Thus, there is a problem that intermittent loading on the cutting edge during cutting causes a crack at the interface between the covering layers or between the covering layer and the substrate and causes the chipping of the tool.

PTL 2 puts the main focus on the surface roughness of the cutting edge portion of the tool. Thus, there is a problem that concentrated intermittent loading at the interface between the covering layers or between the covering layer and the substrate during cutting causes a crack at the interface.

As a result of the problems described above, there is a problem that the falling off or chipping of the covering layer promotes uneven abrasion and lowers the abrasion resistance of the covering layer. These problems generally relate to surface-coated cutting tools and are particularly noticeable in surface-coated cutting tools for use in cutting, such as milling or turning of a grooved member. Surface-coated cutting tools for use in the applications described above frequently suffer from the chipping of the cutting edge under intermittent load. Accordingly, it is an object of the present invention to provide a surface-coated cutting tool having excellent abrasion resistance and defect resistance.

Solution to Problem

A surface-coated cutting tool according to the present invention includes a substrate and a covering layer formed on the substrate. The covering layer includes one or two or more sublayers. In a cross section of the surface-coated cutting tool cut by a plane containing a line normal to a surface of the covering layer at the center of a rake face and an edge line at which two flank faces intersect, a thickness $T_1$ of a portion of the covering layer having the smallest thickness in a cutting edge line portion and a thickness $T_2$ of the covering layer at a point 1 mm away from a cutting edge line in a rake face direction satisfy $T_1 < T_2$. A point a on the surface of the covering layer a distance $D_a$ away from the cutting edge line in the rake face direction and a point b on the surface of the covering layer a distance $D_b$ away from the cutting edge line in a flank face direction satisfy 0.05 mm $\leq D_a \leq$ 0.5 mm and 0.01 mm $\leq D_b \leq$ 0.2 mm. In 10% or more of a region E of the covering layer having a thickness in the range of 0.1 $T_1$ to 0.9 $T_1$ from the surface and extending from the point a to the point b, the deviation in the crystal orientation of crystal grains constituting the covering layer is 5 degrees or more and less than 10 degrees.

$D_a$ preferably satisfies 0.05 mm≦$D_a$≦0.25 mm. The region E preferably has a thickness in the range of 0.5 $T_1$ to 0.9 $T_1$.

Preferably, the covering layer includes a plurality of sublayers, and the structure of the covering layer in the cutting edge line portion is different from the structure of the covering layer in the region other than the cutting edge line portion. The covering layer is preferably composed of a compound containing at least one element selected from the group consisting of group IVa elements (such as Ti, Zr, and Hf), group Va elements (such as V, Nb, and Ta), group VIa elements (such as Cr, Mo, and W), aluminum, and silicon and at least one element selected from the group consisting of carbon, nitrogen, oxygen, and boron. $T_2$ is preferably 3 μm or more and 30 μm or less.

Advantageous Effects of Invention

A surface-coated cutting tool according to the present invention having the structure as described above has excellent abrasion resistance and defect resistance.

DESCRIPTION OF EMBODIMENTS

Figure 1:
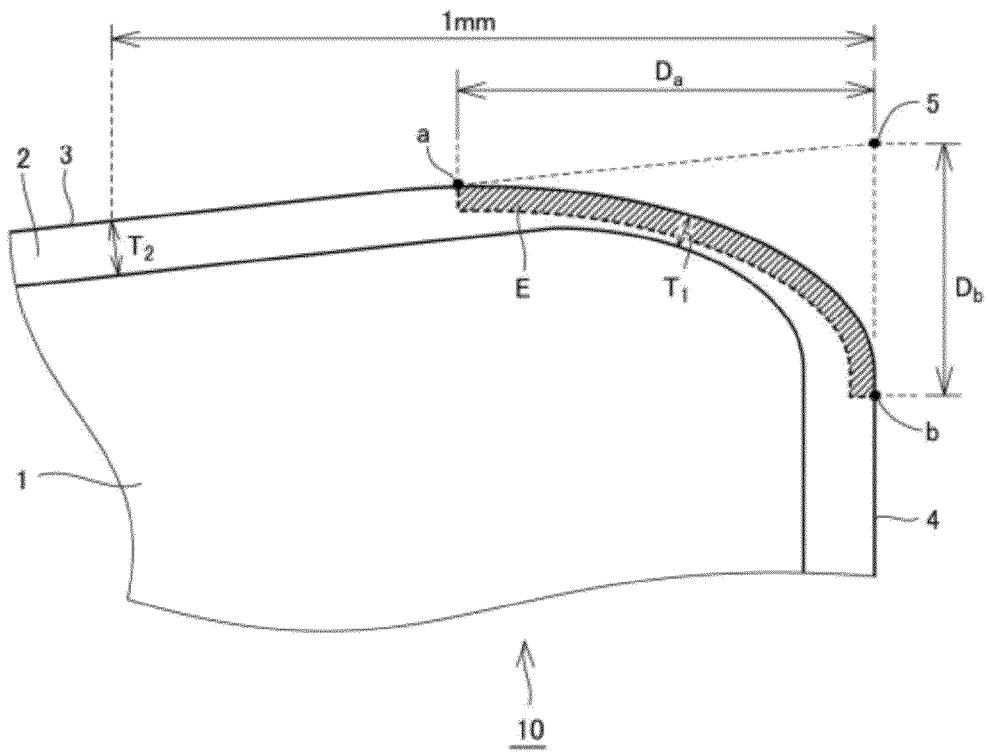
FIG. 1 is a schematic cross-sectional view of the periphery of the cutting edge line portion of a surface-coated cutting tool according to the present invention, cut by a plane containing a line normal to a surface of the covering layer at the center of a rake face and the edge line at which two flank faces intersect.

The present invention will be further described below.
Surface-Coated Cutting Tool A surface-coated cutting tool according to the present invention includes a substrate and a covering layer formed on the substrate. A surface-coated cutting tool having such a structure according to the present invention can be useful as an indexable insert, for example, for use in drilling, end milling, milling, turning, or crankshaft pin milling, but is not limited to these applications and shapes. A surface-coated cutting tool according to the present invention is particularly suitable for cutting applications under intermittent load, such as milling or turning of a grooved member.
Substrate The substrate of a surface-coated cutting tool according to the present invention may be, but is not limited to, a conventionally known substrate for such cutting tools. Examples of the substrate include cemented carbides (including, for example, WC-based cemented carbide and WC-based cemented carbide containing Co and optionally Ti, Ta, or Nb carbonitride), cermets (mainly composed of TiC, TiN, or TiCN), high-speed steel, ceramics (such as titanium carbide, silicon carbide, silicon nitride, aluminum nitride, aluminum oxide, and a mixture thereof), sintered cubic boron nitride compacts, and sintered diamond compacts.

In the present invention, among these substrates, a preferred substrate has a structure containing a plurality of hard phases composed of a hard compound (each of which generally serves as a matrix) and a binding phase for binding the hard phases. In particular, cemented carbides that are manufactured by sintering a powder of a hard compound metal carbide are preferred. The hard compound is preferably composed of at least one compound selected from the group consisting of carbides, nitrides, and carbonitrides of at least one element of group IVa elements, group Va elements, and group VIa elements, and tungsten carbide. The hard compound is also preferably tungsten carbide alone. Specific examples of at least one compound selected from the group consisting of carbides, nitrides, and carbonitrides of at least one element of group IVa elements, group Va elements, and group VIa elements include TiC, TiN, TaC, NbC, ZrCN, $Cr_3C_2$, ZrC, ZrN, and TiCN. The blend ratio of the compound and tungsten carbide and the blend ratio of the compounds are not particularly limited and may be a conventionally known blend ratio. The hard phase may be composed of a cermet instead of the hard compound.

The hard phase composed of the hard compound is hard and has high abrasion resistance. Furthermore, a decrease in the hardness of the hard phase at high temperature is small. Thus, the hard phase is suitable as a material for the substrate of a surface-coated cutting tool according to the present invention.

The binding phase functions to bind the hard phases and is preferably composed of, for example, an iron group metal, that is, at least one element selected from the group consisting of iron, cobalt, and nickel. The binding phase composed of such an element is suitable because the binding phase can strength the bonding between the hard phases, particularly the hard phases composed of a metal carbide. For the hard phase composed of a cermet, the binding phase is particularly preferably cobalt, nickel, or an alloy of cobalt and nickel.

In the present invention, when a cemented carbide is used in the substrate, the cemented carbide even containing free carbon or an anomalous phase called an η phase can produce the advantages of the present invention. The substrate for use in the present invention may be surface-modified. For example, a β-free layer may be formed on a cemented carbide, or a surface-hardened layer may be formed on a cermet. Even with such surface modification, the advantages of the present invention can be obtained.
Covering Layer The covering layer in the present invention includes one or two or more sublayers. In other words, the covering layer may be a monolayer or a composite layer composed of a plurality of sublayers. The formation of such a covering layer on the substrate surface improves the abrasion resistance of the surface-coated cutting tool.

The covering layer in the present invention includes an aspect in which the covering layer covers the entire surface of the substrate, an aspect in which the covering layer partly covers the surface of the substrate, and an aspect in which the covering layer has a different structure in a particular portion of the surface-coated cutting tool. In particular, when such a covering layer is composed of a plurality of sublayers, the structure of the covering layer in the cutting edge line portion described below is preferably different from the structure of the covering layer in the region other than the cutting edge line portion. This can decrease the number of interfaces between films (covering layers) and improve the chipping resistance of the covering layer.

A covering layer according to the present invention may be any covering layer having a conventionally known composition and is, for example, preferably composed of a compound containing a hard ceramic, particularly at least one element selected from the group consisting of group IVa elements, group Va elements, group VIa elements, aluminum, and silicon and at least one element selected from the group consisting of carbon, nitrogen, oxygen, and boron. This can further improve the abrasion resistance of the covering layer.

More specifically, such a compound may be at least one compound selected from the group consisting of carbides, nitrides, carbonitrides, oxides, carbonates, carbonate nitrides, boronitrides, and borocarbonitrides of at least one element selected from the group consisting of group IVa elements, group Va elements, group VIa elements, aluminum, and silicon. More specifically, such a compound may be TiC, TiCN, TiN, TiSiN, TiSiCN, TiCNO, TiHfN, TiNbN, TiTaN, TiAlN, TiAlCrN, TiAlSiN, TiAlSiCrN, TiBN, TiAlBN, TiSiBN, TiBCN, TiAlBCN, TiSiBCN, CrN, MN, AlCrN, $Al_2O_3$, ZrN, ZrCN, $ZrO_2$, VN, or $TiO_2$.

The thickness $T_2$ of the covering layer described below is preferably 3 μm or more and 30 μm or less (the total thickness in the case of the covering layer composed of a plurality of sublayers), more preferably 7 μm or more and 23 μm less. When the thickness is 3 μm or more, the covering layer can have improved abrasion resistance, and the abrasion resistance increases with increasing thickness of the covering layer. The covering layer having a thickness of 30 μm or less can have high defect resistance. While $T_2$ is the thickness on the rake face side, the thickness on the flank face side except the cutting edge line portion is preferably approximately the same as $T_2$.

Characteristics of Cutting Edge Line Portion

The present invention is characterized in that in a cross section of a surface-coated cutting tool according to the present invention cut by a plane containing a line normal to a surface of a covering layer at the center of a rake face and an edge line at which two flank faces intersect, a thickness $T_1$ of a portion of the covering layer having the smallest thickness in a cutting edge line portion and a thickness $T_2$ of the covering layer at a point 1 mm away from a cutting edge line in a rake face direction satisfy $T_1<T_2$, and a point a on the surface of the covering layer a distance $D_a$ away from the cutting edge line in the rake face direction and a point b on the surface of the covering layer a distance $D_b$ away from the cutting edge line in a flank face direction satisfy 0.05 mm$\leq D_a \leq$0.5 mm and 0.01 mm$\leq D_b \leq$0.2 mm, and in 10% or more of a region E of the covering layer having a thickness in the range of $0.1T_1$ to $0.9T_1$ from the surface and extending from the point a to the point b, the deviation in the crystal orientation of crystal grains constituting the covering layer is 5 degrees or more and less than 10 degrees (see FIG. 1). Thus, in a surface-coated cutting tool according to the present invention, the film thickness of the cutting edge line portion from which chipping originates is decreased, and an upper portion of a covering layer cause strain, increasing the cutting edge strength. Consequently, the covering layer can improve the abrasion resistance of the surface-coated cutting tool while falling off or chipping of the covering layer is prevented. Thus, the surface-coated cutting tool can have excellent abrasion resistance and defect resistance.

The terms "cutting edge line" and "cutting edge line portion", as used herein, refer to different concepts. The "cutting edge line" refers to an edge line at which a rake face 3 and an edge line 4 intersect in the cross section of a surface-coated cutting tool 10 according to the present invention (in which a covering layer 2 is formed on a substrate 1). The edge line 4 is a line of intersection of two flank faces. However, such an edge line is processed by honing treatment and does not actually exist. Thus, in the present invention, as illustrated in FIG. 1, the rake face 3 and the edge line 4 at which two flank faces intersect are approximated by straight lines in the cross section, and a point at which the extensions of the straight lines intersect is considered to be a cutting edge line 5.

The "cutting edge line portion" is one of the portions that are most relevant to the cutting of a workpiece during cutting and refers to the periphery of the cutting edge line 5. In the present invention, when the rake face 3 and the edge line 4 at which two flank faces intersect are approximated by straight lines in the cross section, a region between the points at which the straight lines are bent by honing treatment (a region on the covering layer 2 from the inflection point of the rake face 3 to the inflection point of the edge line 4 at which two flank faces intersect) is considered to be the cutting edge line portion (also referred to simply as "cutting edge" in the present invention). The point a and the point b preferably correspond to the inflection point of the rake face 3 and the inflection point of the edge line 4 at which two flank faces intersect, respectively. However, even in the case that the point a and the point b do not correspond to the inflection points, it is also within the scope of the present invention.

With respect to the plane defined above, "the center of a rake face" refers to the center of a rake face in a geometrical sense. In the case that a through-hole for installing the surface-coated cutting tool is formed in the central portion of a rake face, it refers to the center of a rake face in a geometrical sense on the assumption that the through-hole is not formed. The phrase "edge line at which two flank faces intersect" refers to an edge line at which two flank faces intersect. In the case that the edge line does not form a distinct edge line, the phrase refers to a hypothetical edge line at which the geometrical extensions of the two flank faces intersect. When a surface-coated cutting tool has two or more such planes, one of the planes is selected.

In the present invention, in the cross section, when a thickness $T_1$ of a portion of the covering layer having the smallest thickness in a cutting edge line portion and a thickness $T_2$ of the covering layer at a point 1 mm away from a cutting edge line in a rake face direction satisfy $T_1<T_2$, the covering layer in the cutting edge line portion has a reduced thickness, and therefore the cutting edge strength is dramatically improved. In this case, $T_1/T_2$ is preferably $0.05 \leq T_1/T_2$—0.95, more preferably $0.3 \leq T_1/T_2 \leq 0.7$. $T_1/T_2=0$ indicates the formation of no covering layer in the cutting edge line portion, resulting in a marked decrease in the abrasion resistance of the surface-coated cutting tool. $T_1/T_2>0.95$ may result in an insufficient reduction in the thickness of the covering layer in the cutting edge line portion and low defect resistance of the surface-coated cutting tool.

As illustrated in FIG. 1, the present invention is characterized in that a point a on the surface of the covering layer 2 a distance $D_a$ away from the cutting edge line 5 in a rake face 3 direction and a point b on the surface of the covering layer 2 a distance $D_b$ away from the cutting edge line 5 in a flank face direction in the cross section satisfy 0.05 mm$\leq D_a \leq$0.5 mm and 0.01 mm$\leq D_b \leq$0.2 mm, and in 10% or more of a region E of the covering layer 2 having a thickness in the range of 0.1 $T_1$ to 0.9 $T_1$ from the surface and extending from the point a to the point b, the deviation in the crystal orientation of crystal grains constituting the covering layer is 5 degrees or more and less than 10 degrees. This can cause a strain in an upper portion of the covering layer and, in combination with the reduction in thickness, further increase the cutting edge strength. Consequently, the covering layer can improve the abrasion resistance of the surface-coated cutting tool while falling off or chipping of the covering layer is prevented. Thus, the surface-coated cutting tool can have excellent abrasion resistance and defect resistance.

The deviation in the crystal orientation is determined by polishing a surface-coated cutting tool, irradiating the cross section of the covering layer exposed as the polished surface with an electron beam in a field-emission scanning electron microscope, and observing the crystal of the crystal grains constituting the covering layer in the region E at intervals of 50 nm. More specifically, 10,000 crystal grains are observed with a backscattering optical diffraction analyzer to determine the average crystal orientation in each orientation. Among the observation points at intervals of 50 nm, the observation points at which the deviation from the average in each orientation is 5 degrees or more and less than 10 degrees are mapped with an image analysis software (an analysis software attached to the backscattering optical diffraction analyzer can be used). The definition according to the present invention is satisfied when the area within the observation points thus mapped accounts for 10% or more of the region E. The area of less than 10% results in insufficient cutting edge strength and low defect resistance of the surface-coated cutting tool. An increase in the area results in more preferred effects. Thus, the upper limit of the area is not particularly limited. However, an increase in the area results in an increase in the strain of the covering layer and possibly a decrease in the adhesion of the covering layer. Thus, the upper limit of the area is preferably 90%. More preferably, the area accounts for 20% or more and 80% or less of the region E.

When the region E has a thickness of less than 0.1 $T_1$, this results in insufficient cutting edge strength and low defect resistance of the surface-coated cutting tool. A thickness of more than 0.9 $T_1$ results in a decrease in the adhesion between the covering layer and the substrate. Thus, the region E more preferably has a thickness in the range of 0.5 $T_1$ to 0.9 $T_1$.

When $D_a$ or $D_b$ is $D_a$<0.05 mm or $D_b$<0.01 mm, this results in insufficient cutting edge strength and low defect resistance of the surface-coated cutting tool. When $D_a$ or $D_b$ is 0.5 mm<$D_a$ or 0.2 mm<$D_b$, this results in a decrease in the adhesion between the covering layer and the substrate. Thus, $D_a$ and $D_b$ are more preferably 0.05 mm≦$D_a$≦0.25 mm and 0.02 mm≦$D_b$≦0.1 mm.

When the deviation in the crystal orientation is less than 5 degrees, this results in insufficient strain in the covering layer and no improvement in cutting edge strength. When the deviation in the crystal orientation is 10 degrees or more, this results in crystals of a different orientation.

Manufacturing Process

A surface-coated cutting tool according to the present invention can be manufactured in the following manner. First, a substrate is prepared. The substrate includes a plurality of hard phases composed of a hard compound and a binding phase that binds the hard phases. A portion of the substrate corresponding to the cutting edge line portion is then subjected to honing treatment with a brush or a plastic medium. The honing treatment may also involve a method for blasting a substrate with fine particles, for example, made of alumina by shot peening.

A covering layer is then formed on the substrate. For example, the covering layer is formed on the substrate placed in a chamber at a temperature of 800° C. or more and 1100° C. or less by a gas-phase synthesis method, such as a chemical vapor deposition (CVD) method (800° C. or more and 1050° C. or less for a moderate temperature (MT) method). In particular, a covering layer formed by the CVD method has excellent adhesion to the substrate. Thus, the covering layer can have a large thickness and high abrasion resistance. A physical vapor deposition method, such as an ion plating method or an ion sputtering method, may be used instead of the CVD method.

In order to form the region E in the covering layer thus formed, a portion of the rake face, for example, within 0.5 mm from the cutting edge line and a portion of the flank face, for example, within 0.2 mm from the cutting edge line are left uncovered, and the other portion is masked, for example, with a metallic plate (for example, made of stainless steel) having a thickness in the range of 0.2 to 3.2 mm. The masked portion and the unmasked portion of the covering layer (within the cutting edge line portion and its periphery) are subjected to honing treatment by shot peening or by using a brush or a plastic medium. The masking can prevent or reduce the entering of the medium into the masked portion during the honing treatment. Thus, a strain (a deviation in crystal orientation) can be produced only in the unmasked portion. The unmasked portion is the region between the point a and the point b in FIG. 1. The position of the masked portion can be controlled so that the distances $D_a$ and $D_b$ satisfy 0.05 mm≦$D_a$≦0.5 mm and 0.01 mm≦$D_b$≦0.2 mm. Honing treatment without masking cannot produce a strain (a deviation in the crystal orientation) in the region between the point a and the point b in FIG. 1 and therefore cannot improve the defect resistance of the surface-coated cutting tool.

When the honing treatment conditions include the combination of two or more media and the use of a metallic plate for masking having a thickness in the range of 0.2 to 3.2 mm, the deviation in the crystal orientation and the percentage of the region can be controlled.

In order to differentiate two different functions of grinding and the application of stress, the media are preferably combined so as to precisely control the honing treatment. That is, a material that has high grinding ability and high hardness and a material that has low grinding ability and can give an impact to an object to be ground to provide a stress are preferably combined. Examples of the former material include SiC, TiC, and diamond. Examples of the latter material include $Al_2O_3$ and $ZrO_2$.

EXAMPLES

Although the present invention will be further described in the following examples, the present invention is not limited to these examples.

Example 1

A cemented carbide base material having the shape of a cutting tool of JIS B 4120 (1998) CNMG120408 according to Japanese Industrial Standard (JIS) was prepared as a substrate. Three substrates for each of the samples (A1 to A6) described below were prepared (18 substrates in total). The composition of the substrates was 87.0% by weight WC, 7.0% by weight Co, 3.0% by weight TiC, and 3.0% by weight NbC.

A cutting edge line portion of the substrate was subjected to honing treatment with a SiC brush or the like. A covering layer was then formed on the substrate subjected to the honing treatment. The covering layer was formed by a CVD method. First, a TiN sublayer having a thickness of 1.0 μm was formed on the substrate surface. On the TiN sublayer, a moderate temperature (MT) TiCN sublayer having a thickness of 10.0 μm, a TiN sublayer having a thickness of 1.0 μm, an $Al_2O_3$ sublayer having a thickness of 4.0 μm, and a TiN sublayer having a thickness of 1.5 μm were then formed in this order. These thicknesses were the thicknesses $T_2$.

A portion of the rake face of the covering layer within 0.5 mm from the cutting edge line and a portion of the flank face of the covering layer within 0.2 mm from the cutting edge line were left uncovered, and the other portion was masked with a metallic plate (made of SUS 304) having the following thickness. That is, the thicknesses were 0.1 mm for the sample A2, 0.5 mm for the sample A3, 1.0 mm for the sample A4, 2.0 mm for the sample A5, and 5.0 mm for the sample A6. The sample A1 was not masked. The masked portion and the unmasked portion (within the cutting edge line portion and its periphery) of the samples A2 to A6 and a portion of the sample A1 similar to those of the samples A2 to A6 were subjected to honing treatment with a combination brush of 75% by area of a SiC brush and 25% by area of an alumina brush under the same conditions (conditions: the number of revolutions 1500 rpm, the feed speed 5000 mm/min, and the depth of cut 3.0 mm).

Among the samples (surface-coated cutting tools) thus prepared, one of each of the samples was cut along a plane containing a line normal to a surface of the covering layer at the center of the rake face and an edge line at which two flank faces intersect, and the cross section was mechanically polished. The deviation in crystal orientation was determined by irradiating the cross section of the covering layer exposed as the polished surface with an electron beam in a field-emission scanning electron microscope and observing the crystal orientation of the crystal grains constituting the covering layer in the region E at intervals of 50 nm. A specific method of such measurement followed the method described above. Simultaneously with the measurement, the thickness $T_1$ of a portion of the covering layer having the smallest thickness in the cutting edge line portion and $D_a$ and $D_b$ were measured.

Table I shows the results. $T_1$ and $T_2$ were expressed in μm. $D_a$ and $D_b$ were expressed in mm.

Figure 2:
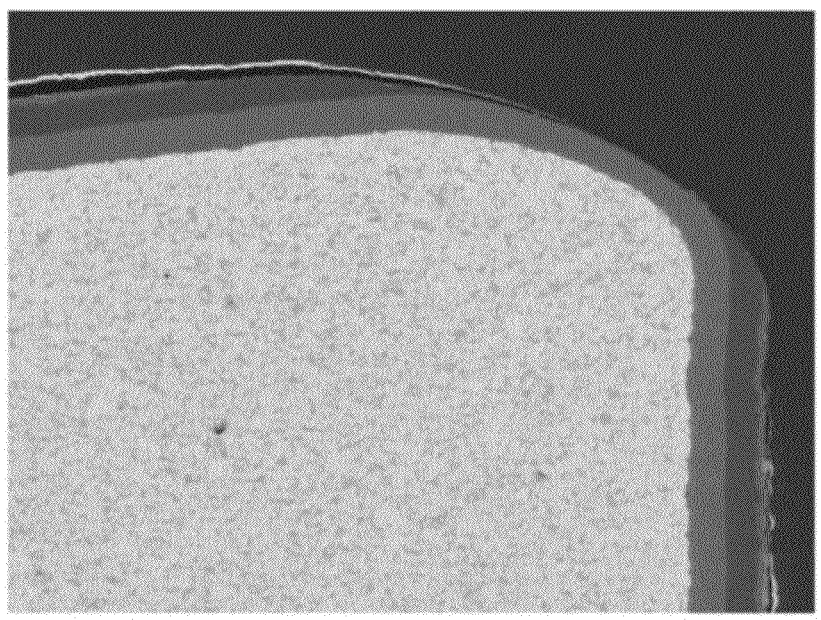
FIG. 2 is a photomicrograph of the periphery of the cutting edge line portion of a surface-coated cutting tool according to the present invention.

Among the samples that had not been cut, one of each of the samples was used to determine abrasion resistance under the conditions described below. Among the remaining samples, one of each of the samples was used to determine defect resistance (chipping resistance) under the conditions described below. Table I also shows the results. A photomicrograph of the cross section of the sample A3 was shown in FIG. 2 (photographing conditions: a magnification of 500 with a scanning electron microscope).

Evaluation of Abrasion Resistance
   Workpiece: SCM435 (JIS)
   Cutting speed: 300 m/min.
   Feed speed: 0.3 mm/rev.
   Depth of cut: 1.5 mm
   Cutting oil: wet
   Cutting time: 20 min.
   Evaluation: flank wear was measured (a smaller value indicates higher abrasion resistance).

Evaluation of Defect Resistance
   Workpiece: SCM435 (JIS) grooved member
   Cutting speed: 330 m/min.
   Feed speed: 0.25 mm/rev.
   Depth of cut:1.5 mm
   Cutting oil: wet
   Evaluation: elapsed time before chipping or causing a defect (a longer elapsed time indicates higher defect resistance).

TABLE I

| Sample No. | $T_1$ | $T_2$ | $D_a$ | $D_b$ | Thickness of region E | Percentage relative to region E (%) | Flank wear (mm) | Impact time (min) |
|---|---|---|---|---|---|---|---|---|
| A1 | 3.5 | 17.5 | 1.30 | 0.50 | 0.95 $T_1$ | 54 | 0.15 | 2.3 |
| A2 | 5.3 | 17.5 | 0.70 | 0.20 | 0.80 $T_1$ | 43 | 0.15 | 4.2 |
| A3 | 8.8 | 17.5 | 0.31 | 0.10 | 0.73 $T_1$ | 25 | 0.16 | 5.6 |
| A4 | 10.5 | 17.5 | 0.13 | 0.06 | 0.58 $T_1$ | 19 | 0.17 | 6.3 |
| A5 | 14.0 | 17.5 | 0.07 | 0.03 | 0.54 $T_1$ | 12 | 0.18 | 4.4 |
| A6 | 16.6 | 17.5 | 0.03 | 0.01 | 0.25 $T_1$ | 4 | 0.30 | 1.4 |

In Table I, the column of "Thickness of region E" indicates the thickness of the region E, and the column of "Percentage relative to region E" indicates the percentage of a region in which the deviation in the crystal orientation of crystal grains was 5 degrees or more and less than 10 degrees, based on the region E.

In Table I, the samples A3 to A5 are examples, and the samples A1, A2, and A6 are comparative examples. Table I clearly shows that the samples A3 to A5, which were examples of the present invention, had substantially the same flank wear as the samples A1 and A2 and a dramatically longer elapsed time before chipping or causing a defect ("Impact time" in Table I) than the samples A1 and A2. The sample A6 had a greater flank wear and a shorter impact time than the samples A3 to A5. Thus, these results show that a surface-coated cutting tool according to the present invention has excellent abrasion resistance and defect resistance.

Example 2

A cemented carbide base material having the shape of a cutting tool of JIS B 4120 (1998) CNMG120408 according to Japanese Industrial Standard (JIS) was prepared as a substrate. Three substrates for each of the samples (B1 to B5) described below were prepared (15 substrates in total). The composition of the substrate was 88.0% by weight WC, 5.0% by weight Co, 3.0% by weight TiC, 2.0% by weight TaC, and 2.0% by weight NbC.

A cutting edge line portion of the substrate was subjected to honing treatment with a SiC brush or the like. A covering layer was then formed on the substrate subjected to the honing treatment. The covering layer was formed by a CVD method. First, a TiN sublayer having a thickness of 0.5 μm was formed on the substrate surface. On the TiN sublayer, a moderate temperature (MT) TiCN sublayer having a thickness of 10.0 μm, a TiBN sublayer having a thickness of 1.0 μm, an $Al_2O_3$ sublayer having a thickness of 6.0 μm, and a TiN sublayer having a thickness of 1.5 μm were then formed in this order. These thicknesses were the thicknesses $T_2$.

A portion of the rake face of the covering layer within 0.5 mm from the cutting edge line and a portion of the flank face of the covering layer within 0.2 mm from the cutting edge line were left uncovered, and the other portion was masked with a metallic plate (made of SUS 304) having a thickness of 1 mm. The masked portion and the unmasked portion (within the cutting edge line portion and its surrounding area) were subjected to honing treatment by shot peening at a shot pressure of 0.2 MPa with a combination medium containing 15% by mass SiC abrasive grains and 85% by mass alumina abrasive grains for the following treatment times. The treatment times were 1 second for the sample B1, 5 seconds for the sample B2, 10 seconds for the sample B3, 15 seconds for the sample B4, and 20 seconds for the sample B5.

Among the samples (surface-coated cutting tools) thus prepared, one of each of the samples was cut along a plane containing a line normal to a surface of the covering layer at the center of the rake face and an edge line at which two flank faces intersect, and the cross section was mechanically polished. The deviation in crystal orientation was determined by irradiating the cross section of the covering layer exposed as the polished surface with an electron beam in a field-emission scanning electron microscope and observing the crystal of the crystal grains constituting the covering layer in the region E at intervals of 50 nm.

A specific method of such measurement followed the method described above. Simultaneously with the measurement, the thickness $T_1$ of a portion of the covering layer having the smallest thickness in the cutting edge line portion and $D_a$ and $D_b$ were measured. Table II shows these results. $T_1$ and $T_2$ were expressed in μm. $D_a$ and $D_b$ were expressed in mm.

Among the samples that had not been cut, one of each of the samples was used to determine abrasion resistance under the conditions described in Example 1. Among the remaining samples, one of each of the samples was used to determine defect resistance (chipping resistance) under the conditions described in Example 1. Table II also shows the results.

TABLE II

| Sample No. | $T_1$ | $T_2$ | $D_a$ | $D_b$ | Thickness of region E | Percentage relative to region E (%) | Flank wear (mm) | Impact time (min) |
|---|---|---|---|---|---|---|---|---|
| B1 | 17.7 | 19.0 | 0.03 | 0.02 | 0.02 $T_1$ | 7 | 0.12 | 1.4 |
| B2 | 14.8 | 19.0 | 0.09 | 0.03 | 0.16 $T_1$ | 13 | 0.10 | 3.2 |
| B3 | 9.5 | 19.0 | 0.15 | 0.05 | 0.57 $T_1$ | 21 | 0.12 | 3.6 |
| B4 | 6.1 | 19.0 | 0.21 | 0.09 | 0.83 $T_1$ | 45 | 0.11 | 3.4 |
| B5 | 2.7 | 19.0 | 0.43 | 0.16 | 0.98 $T_1$ | 62 | 0.17 | 1.6 |

In Table I, the column of "Thickness of region E" indicates the thickness of the region E, and the column of "Percentage relative to region E" indicates the percentage of a region in which the deviation in the crystal orientation of crystal grains was 5 degrees or more and less than 10 degrees, based on the region E.

In Table II, the samples B2 to B4 are examples, and the samples B1 and B5 are comparative examples. Table II clearly shows that the samples B2 to B4, which were examples of the present invention, had substantially the same flank wear as the sample B1 and a dramatically longer elapsed time before chipping or causing a defect ("Impact time" in Table II) than the sample B1. The sample B5 had a greater flank wear and a shorter impact time than the samples B2 to B4. Thus, these results show that a surface-coated cutting tool according to the present invention has excellent abrasion resistance and defect resistance.

Although the embodiments and examples of the present invention have been described, appropriate combinations of the constituents of the embodiments and examples were also originally envisaged.

It is to be understood that the embodiments and examples described above are illustrated by way of example and not by way of limitation in all respects. The scope of the present invention is defined by the appended claims rather than by the description preceding them. All modifications that fall within the scope of the claims and the equivalents thereof are therefore intended to be embraced by the claims.

| Reference Signs List | |
|---|---|
| 1 | Substrate |
| 2 | Covering layer |
| 3 | Rake face |
| 4 | Edge line at which two flank faces intersect |
| 5 | Cutting edge line |
| 10 | Surface-coated cutting tool |

The invention claimed is:

1. A surface-coated cutting tool comprising:
a substrate; and
a covering layer formed on the substrate,
wherein the covering layer includes one or two or more sublayers,
a thickness $T_1$ of a portion of the covering layer having the smallest thickness in a cutting edge line portion and a thickness $T_2$ of the covering layer at a point 1 mm away from a cutting edge line in a rake face direction in a cross section of the surface-coated cutting tool cut by a plane containing a line normal to a surface of the covering layer at the center of a rake face and an edge line at which two flank faces intersect satisfy $T_1 < T_2$, and
a point a on the surface of the covering layer a distance $D_a$ away from the cutting edge line in the rake face direction and a point b on the surface of the covering layer a distance $D_b$ away from the cutting edge line in a flank face direction satisfy 0.05 mm $\leq D_a \leq$ 0.5 mm and 0.01 mm $\leq D_b \leq$ 0.2 mm, and in 10% or more of a region E of the covering layer having a thickness in the range of $0.1T_1$ to $0.9T_1$ from the surface and extending from the point a to the point b, the deviation in the crystal orientation of crystal grains constituting the covering layer is 5 degrees or more and less than 10 degrees.

2. The surface-coated cutting tool according to claim 1, wherein the $D_a$ satisfies 0.05 mm $\leq D_a \leq$ 0.25 mm.

3. The surface-coated cutting tool according to claim 1, wherein the region E has a thickness in the range of $0.5T_1$ to $0.9T_1$.

4. The surface-coated cutting tool according to claim 1, wherein the covering layer includes a plurality of sublayers, and the structure of the covering layer in the cutting edge line portion is different from the structure of the covering layer in the region other than the cutting edge line portion.

5. The surface-coated cutting tool according to claim 1, wherein the $T_2$ is 3 μm or more and 30 μm or less.

6. The surface-coated cutting tool according to claim 1, wherein a relationship defined as $0.05 \leq T_1/T_2 \leq 0.95$ is satisfied.

7. The surface-coated cutting tool according to claim 1, wherein a relationship defined as $0.3 \leq T_1/T_2 \leq 0.7$ is satisfied.

8. The surface-coated cutting tool according to claim 1, wherein, in order to achieve the deviation in the crystal orientation of crystal grains constituting the covering layer of 5 degrees or more and less than 10 degrees, the 10% or more of the region E is formed by masking a first portion of the rake face beyond a first distance from the cutting edge line and masking a second portion of the flank face beyond a second distance from the cutting edge line, and performing a honing treatment on a first unmasked portion of the rake face within the first distance from the cutting edge line and on a second unmasked portion of the flank face within the second distance from the cutting edge line.

9. The surface-coated cutting tool according to claim 8, wherein a strain is only produced in the first unmasked portion and the second unmasked portion of the surface-coated cutting tool during the honing treatment, and a strain is not produced in the first masked portion and the second masked portion of the surface-coated cutting tool during the honing treatment.

10. The surface-coated cutting tool according to claim 8, wherein the first portion and the second portion are masked using a metallic plate.

11. The surface-coated cutting tool according to claim 10, wherein the metallic plate has a thickness in a range of 0.2 to 3.2 mm.

12. The surface-coated cutting tool according to claim 8, wherein the first distance is 0.5 mm, and wherein the second distance is 0.2 mm.

13. The surface-coated cutting tool according to claim 8, wherein the honing treatment includes shot peening.

14. The surface-coated cutting tool according to claim 8, wherein the honing treatment includes grinding.

15. The surface-coated cutting tool according to claim 14, wherein the grinding includes grinding using two or more media.

16. The surface-coated cutting tool according to claim 15, wherein the grinding includes grinding using a first material having high grinding ability and high hardness, and a second material having low grinding ability.

17. The surface-coated cutting tool according to claim 16, wherein the first material includes SiC, TiC, or diamond, and wherein the second material includes $Al_2O_3$ or $ZrO_2$.

18. The surface-coated cutting tool according to claim 11, wherein the honing treatment includes grinding using two or more media.

19. The surface-coated cutting tool according to claim 18, wherein the grinding includes grinding using a first material having high grinding ability and high hardness, and a second material having low grinding ability.

20. The surface-coated cutting tool according to claim 19, wherein the first material includes SiC, TiC, or diamond, and wherein the second material includes $Al_2O_3$ or $ZrO_2$.

* * * * *